(12) United States Patent
Kuttner et al.

(10) Patent No.: US 8,368,144 B2
(45) Date of Patent: Feb. 5, 2013

(54) ISOLATED MULTIGATE FET CIRCUIT BLOCKS WITH DIFFERENT GROUND POTENTIALS

(75) Inventors: Franz Kuttner, Ulrich (AT); Gerhard Knoblinger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 825 days.

(21) Appl. No.: 11/612,233

(22) Filed: Dec. 18, 2006

(65) Prior Publication Data

US 2008/0142907 A1    Jun. 19, 2008

(51) Int. Cl.
  *H01L 27/12*    (2006.01)
(52) U.S. Cl. ... 257/351; 257/347; 257/401; 257/E27.06; 257/E27.112; 438/283
(58) Field of Classification Search ............... 257/347, 257/351, 401; 438/283
  See application file for complete search history.

(56) References Cited

U.S. PATENT DOCUMENTS

| | | | |
|---|---|---|---|
| 5,610,426 A * | 3/1997 | Asai et al. ................ | 257/360 |
| 6,389,063 B1 | 5/2002 | Kanekawa et al. | |
| 6,433,609 B1 * | 8/2002 | Voldman ................. | 327/313 |
| 6,608,744 B1 * | 8/2003 | Kato ....................... | 361/111 |
| 6,800,910 B2 | 10/2004 | Lin et al. | |
| 6,949,768 B1 * | 9/2005 | Anderson et al. ......... | 257/74 |
| 6,953,968 B2 | 10/2005 | Nakamura et al. | |
| 7,098,477 B2 | 8/2006 | Zhu | |
| 7,170,772 B1 * | 1/2007 | Buyuktosunoglu et al. .. | 365/129 |
| 7,180,135 B1 * | 2/2007 | Ioannou et al. ........... | 257/347 |
| 7,498,637 B2 * | 3/2009 | Yamaoka et al. .......... | 257/351 |
| 7,530,037 B2 * | 5/2009 | Dao ......................... | 716/119 |
| 2002/0113270 A1 * | 8/2002 | Bernstein et al. .......... | 257/369 |
| 2003/0116806 A1 * | 6/2003 | Kato ........................ | 257/357 |
| 2003/0213995 A1 * | 11/2003 | Duvvury et al. .......... | 257/355 |
| 2004/0100306 A1 * | 5/2004 | Krivokapic et al. ....... | 326/112 |
| 2004/0155281 A1 * | 8/2004 | Osada et al. .............. | 257/315 |
| 2005/0001273 A1 * | 1/2005 | Bryant et al. ............. | 257/369 |
| 2005/0019999 A1 * | 1/2005 | Yamada et al. ........... | 438/197 |
| 2005/0199919 A1 * | 9/2005 | Liu et al. .................. | 257/288 |
| 2005/0237650 A1 * | 10/2005 | Ehrlich .................... | 360/60 |
| 2005/0242395 A1 * | 11/2005 | Chen et al. ............... | 257/347 |
| 2005/0285161 A1 * | 12/2005 | Kang et al. ............... | 257/288 |
| 2006/0043428 A1 * | 3/2006 | Nishimura et al. ........ | 257/211 |

(Continued)

FOREIGN PATENT DOCUMENTS

JP    2003-229575    *    8/2003
KR    20050095581 A        9/2005

(Continued)

OTHER PUBLICATIONS

"Korea Application Serial No. 2007-0132200, Office Action mailed May 27, 2009", 6 pgs.

*Primary Examiner* — A. Sefer

(74) *Attorney, Agent, or Firm* — Schwegman, Lundberg & Woessner, P.A.

(57) ABSTRACT

An electronic circuit on a semiconductor substrate having isolated multiple gate field effect transistor circuit blocks is disclosed. In some embodiments, an electronic circuit has a substrate having a buried oxide insulating region. A MuGFET device may be formed above the buried oxide region and coupled to a first source of reference potential. A semiconductor device may be formed above the substrate and coupled to a second source of reference potential. A coupling network may be formed to couple the MuGFET device to the semiconductor device.

26 Claims, 4 Drawing Sheets

U.S. PATENT DOCUMENTS

| | | |
|---|---|---|
| 2006/0055379 A1 | 3/2006 | Yamamoto et al. |
| 2006/0076628 A1* | 4/2006 | Anderson et al. ............. 257/373 |
| 2006/0084212 A1* | 4/2006 | Anderson et al. ............. 438/197 |
| 2006/0087470 A1 | 4/2006 | Abdoulin |
| 2006/0097770 A1 | 5/2006 | Disney |
| 2006/0119391 A1 | 6/2006 | Sutardja |
| 2006/0133163 A1 | 6/2006 | Darrer |
| 2006/0145251 A1 | 7/2006 | Ko |
| 2006/0181917 A1 | 8/2006 | Kang et al. |
| 2006/0208300 A1* | 9/2006 | Iwanaga et al. ............... 257/308 |
| 2007/0018201 A1* | 1/2007 | Specht et al. ................. 257/204 |
| 2007/0069293 A1* | 3/2007 | Kavalieros et al. ........... 257/350 |
| 2007/0080387 A1* | 4/2007 | Liu et al. ....................... 257/303 |
| 2007/0085624 A1 | 4/2007 | Sanchez |
| 2008/0020515 A1* | 1/2008 | White et al. .................. 438/118 |
| 2008/0224217 A1* | 9/2008 | Knoblinger .................... 257/350 |
| 2009/0179269 A1* | 7/2009 | Hook et al. .................... 257/351 |

FOREIGN PATENT DOCUMENTS

| | | |
|---|---|---|
| KR | 20060031676 A | 4/2006 |
| WO | WO-0122493 A1 | 3/2001 |
| WO | WO-03030262 A2 | 4/2003 |
| WO | WO-2004059703 A1 | 5/2004 |

* cited by examiner

ISOLATED MULTIGATE FET CIRCUIT BLOCKS WITH DIFFERENT GROUND POTENTIALS

TECHNICAL FIELD

The various embodiments described herein relate to semiconductor circuits which include multigate field effect transistor devices.

BACKGROUND

Multigate field effect transistor devices are often designed for applications with down-scaled, extremely small devices which operate at low supply voltages. In some applications, it is necessary for devices to be coupled to other devices which operate at higher supply voltages.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

In the following description, the terms "wafer" and "substrate" may be used interchangeably to refer generally to any structure on which integrated circuits are formed and also to such structured during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "multiple gate field effect transistor" (MuGFET) is used interchangeably with FinFET herein for the general class of semiconductor devices having field effect transistors formed above a buried oxide layer of a substrate.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

The following disclosure relates in general to providing for operation of structure employing multiple circuit blocks, some of which include MuGFET devices. Multiple MuGFET devices are formed above a buried oxide region of a single substrate and supported by the substrate. Because the MuGFET devices are electrically insulated from the substrate and each other by being formed above the buried oxide region, individual devices can be connected to separate sources of reference potential and to separate power supplies. Other semiconductor devices may also be formed above and supported by the substrate in regions thereof which are not insulated by the buried oxide region. The various circuit blocks can be coupled to each other by a suitable coupling element or coupling network despite their being operatively coupled to different sources of reference potential. In some embodiments the circuit blocks are driven from different power sources.

Figure 1:
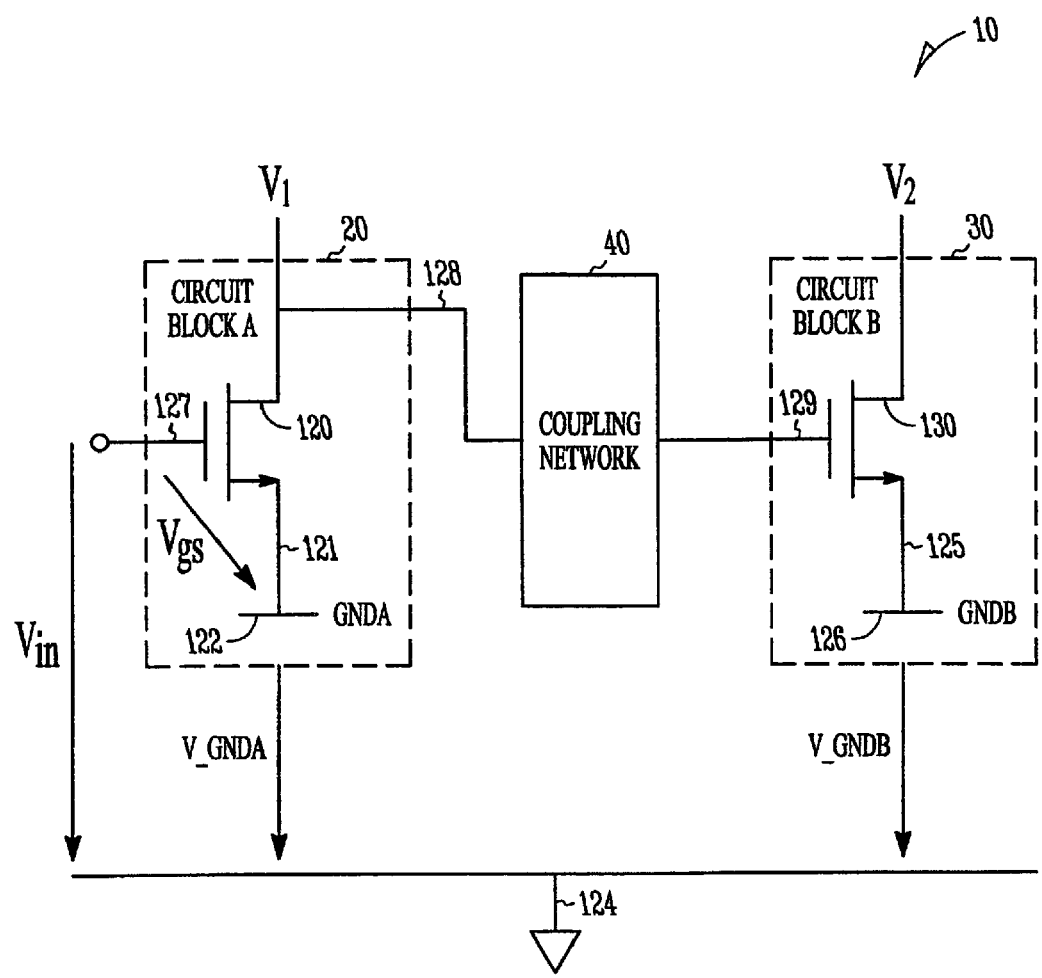
FIG. 1 is a simplified schematic diagram of some embodiments showing two electronic circuit blocks formed above a substrate.
Figure 2:
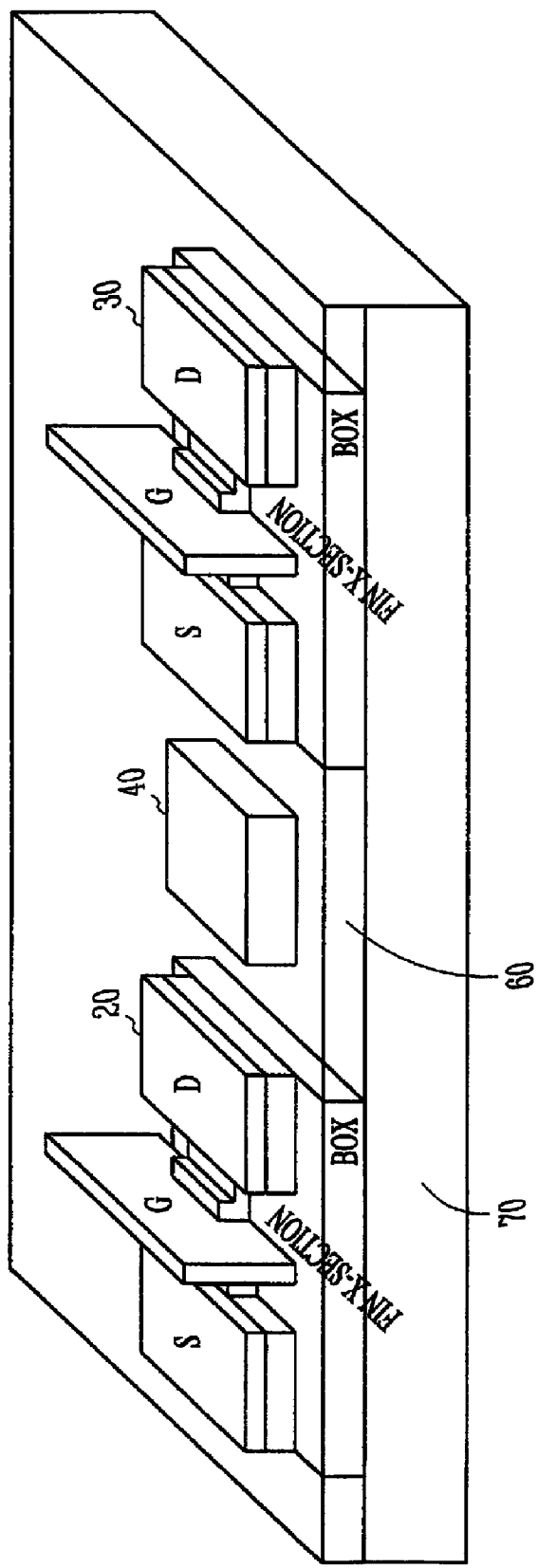
FIG. 2 is a 3D visualization of some embodiments of a substrate showing two electronic circuit blocks and a coupling network formed above the substrate.

Some embodiments of the invention are shown in FIGS. 1 and 2. FIG. 1 is a simplified schematic drawing of an electronic circuit 10 where two circuit blocks 20 and 30 are electrically coupled to each other by a coupling element or network 40. FIG. 2 is a 3 dimensional visualization of circuit 10 of FIG. 1 where circuit blocks 20 and 30 and a coupling network 40 to couple circuit block 20 to circuit block 30 are formed above a buried oxide region 60 of a substrate 70.

In FIG. 2, only some elements of the electronic circuit are shown. Interconnections between circuit blocks are not illustrated and insulating material which, in some embodiments, covers circuit blocks 20 and 30 and coupling element or network 40 is not shown.

In some embodiments, the buried oxide region 60 extends over substantially the entire surface of substrate 70. In some embodiments, the buried oxide region 60 extends over less than the entire surface of substrate 60 and some of the circuit blocks 20 and 30 are formed above and or in the substrate.

In some embodiments shown in FIG. 1, an electronic circuit block 20 is shown with a single MuGFET 120, although other embodiments may have multiple MuGFETs. In some embodiments, MuGFETs may be used in circuit blocks 20 or 30 in combination with other electronic components.

One source/drain region 121 of MuGFET 120 is coupled to a local source of reference potential 122 or local ground A which is shown in FIG. 1 to be at a voltage of $V_{GNDA}$ above a common reference potential 124.

Similarly in circuit block 30, a source/drain region 125 of MuGFET 130 is coupled to a local source of reference potential 126 or local ground B which is at a voltage of $V_{GNDB}$ above the arbitrary common reference potential 124. In some embodiments, circuit block 30 is a CMOS device formed above substrate 70 in a portion of the surface that is not insulated from the substrate 70 by buried oxide region 60.

In some embodiments, circuit block 20 is a MuGFET which is insulated from substrate 70 by buried oxide region 60 and circuit block 30 is a semiconductor device, such as a CMOS, that is not insulated from substrate 70. In those embodiments, each of the two circuit blocks can still operate with a different source of reference potential because the MuGFET circuit block 20 is insulated from CMOS circuit block 23 by buried oxide region 60. In this embodiment, the coupling of circuit block 20 to circuit block 30 still occurs through coupling element 40.

An input signal, $V_{in}$, is applied to an input or gate terminal 127 of MuGFET 120. An output signal from the other source/drain terminal 128 of MuGFET 120 is coupled to an input or gate terminal 129 of MuGFET 130 by coupling network 40.

Various embodiments of coupling networks or elements 40 are discussed below and shown in FIGS. 3-6. In some embodiments, circuit block 20 is connected to a first power source $V_1$, and circuit 20 is connected to a second power source $V_2$. In various embodiments, the first power source provides a voltage $V_1$, above the local source of reference potential $V_{GNDA}$, and the second power source provides a voltage $V_2$, above the local source of reference potential $V_{GNDB}$.

In some embodiments, the voltage magnitude $V_1$ of the first power source and the input signal $V_{in}$ may be relatively high but setting the ground potential of $V_{GNDA}$ above the arbitrary common reference potential keeps the voltage applied between the input gate terminal 127 of MuGFET 120 from exceeding the maximum allowed voltage which may be relatively low. In some embodiments, the output voltage of the second power source substantially exceeds the output voltage of the first power source.

As shown in FIG. 2, circuit blocks 20 and 30 are formed above buried oxide region 60 of substrate 70. For clarity, no interconnections between circuit blocks 20, 30 and coupling network 40 are shown. Similarly, insulating material that would, in some embodiments, be applied to protect circuit blocks 20, 30 and coupling network 40 has not been shown. In some embodiments, additional circuit blocks and coupling elements will also be formed above substrate 70.

In FIG. 2, coupling network 40 is simply shown as a block with no further detail illustrated. Some additional embodiments of the coupling network 40 are provided in the schematic drawings of FIGS. 3-6.

In some embodiments, the voltage $V_{GNDA}$ of the first local source of reference potential 122 can have a different value compared to the voltage $V_{GNDB}$ of the second local source of reference potential 126. Depending upon the applications and the voltages $V_{GNDA}$ and $V_{GNDB}$, several embodiments of coupling circuit 80 are used to couple signals between circuit blocks 20 and 30.

Figure 3:
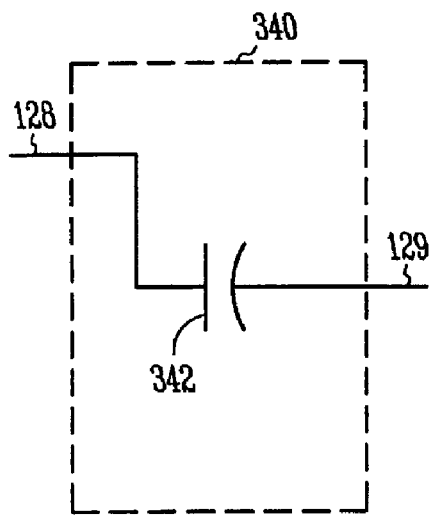
FIG. 3 is a schematic diagram of some embodiments of a coupling element which comprises a capacitor.
Figure 4:
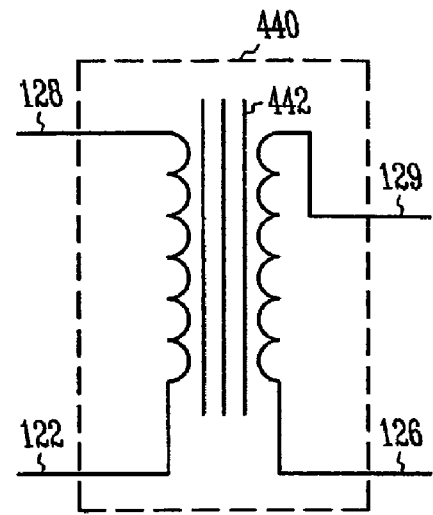
FIG. 4 is a schematic diagram of some embodiments of a coupling element or network which comprises a transformer.
Figure 5:
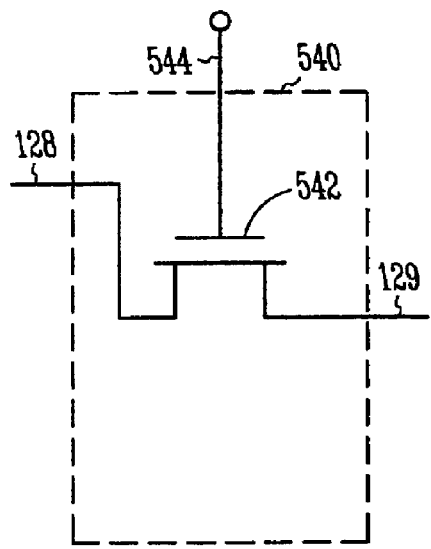
FIG. 5 is a schematic diagram of some embodiments of a coupling element or network which comprises an optical coupled device.

In some embodiments circuit 20 is directly coupled to circuit 30 by a conductive or resistive coupling (not shown). In other embodiments, a capacitive coupling is provided as shown in FIG. 3, a transformer coupling is shown in FIG. 4 and in some embodiments a semiconductor coupling element is provided as shown in FIG. 5. The various coupling elements or networks are further discussed below.

FIG. 3 is a schematic diagram of some embodiments of a capacitive coupling element or network 340 which is used in some embodiments of the coupling element or network 40 of FIGS. 1 and 2. A capacitor 342 has a plate thereof coupled to a source/drain 127 of MuGFET 120 and another plate coupled to gate 129 of MuGFET 130. Coupling element 340 provides coupling of AC signals from circuit block 20 to circuit block 30 while blocking DC voltage from being coupled between them. In some embodiments, additional capacitors and circuit elements are provided.

FIG. 4 is a schematic diagram of some embodiments of a transformer capacitive coupling element or network 440 which is used in some embodiments of coupling element or network 40 of FIGS. 1 and 2. A transformer 440 provides coupling of AC signals from circuit block 20 to circuit block 30 while blocking DC signals from being coupled between them. The "low" side of the primary and secondary transformer windings are coupled to local sources of reference potential 122 and 126. In some embodiments, additional circuit elements are provided.

FIG. 5 is a schematic diagram of some embodiments of a MuGFET coupling element or network 540 formed above the buried oxide region 60. The MuGFET is used in some embodiments of coupling element or network 40 of FIGS. 1 and 2. A MuGFET 542 is used to connect signals between circuit blocks 20 and 30 when a suitable bias voltage is applied to gate 544. The bias voltage is selected to bias MuGFET 542 into a conductive state and is dependent upon the relative magnitudes of $V_1$, $V_2$, $V_{GNDA}$, and $V_{GNDB}$. In some embodiments, additional circuit elements are provided.

Figure 6:
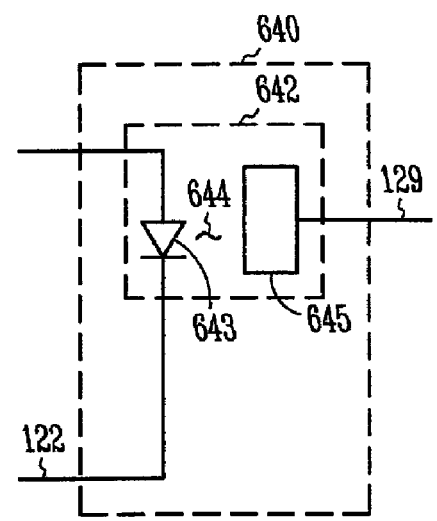
FIG. 6 is a schematic diagram of some embodiments of a coupling element or network which comprises a multiple gate field effect transistor.

FIG. 6 is a schematic diagram of some embodiments of an optical coupling element or network 640 which is used in some embodiments of coupling element or network 40 of FIGS. 1 and 2. In some embodiments, the optical coupler 642 receives the output signal of circuit block 20 and converts it to an optical output 644 by a transducer 643. The optical signal is proportional to the magnitude of the drive signal from electronic block 20. In some embodiments, the transducer 643 is a light emitting diode. In some embodiments, the optical output 644 is received by a light receiving transducer 645 to produce an electrical signal at the input of circuit block 30 which is proportional to the received optical signal. In some embodiments the light receiving transducer 645 is a photocell. In some embodiments, additional circuit elements are provided to form a coupling network to couple the MuGFET circuit block 20 to the semiconductor circuit block 30.

Figure 7:
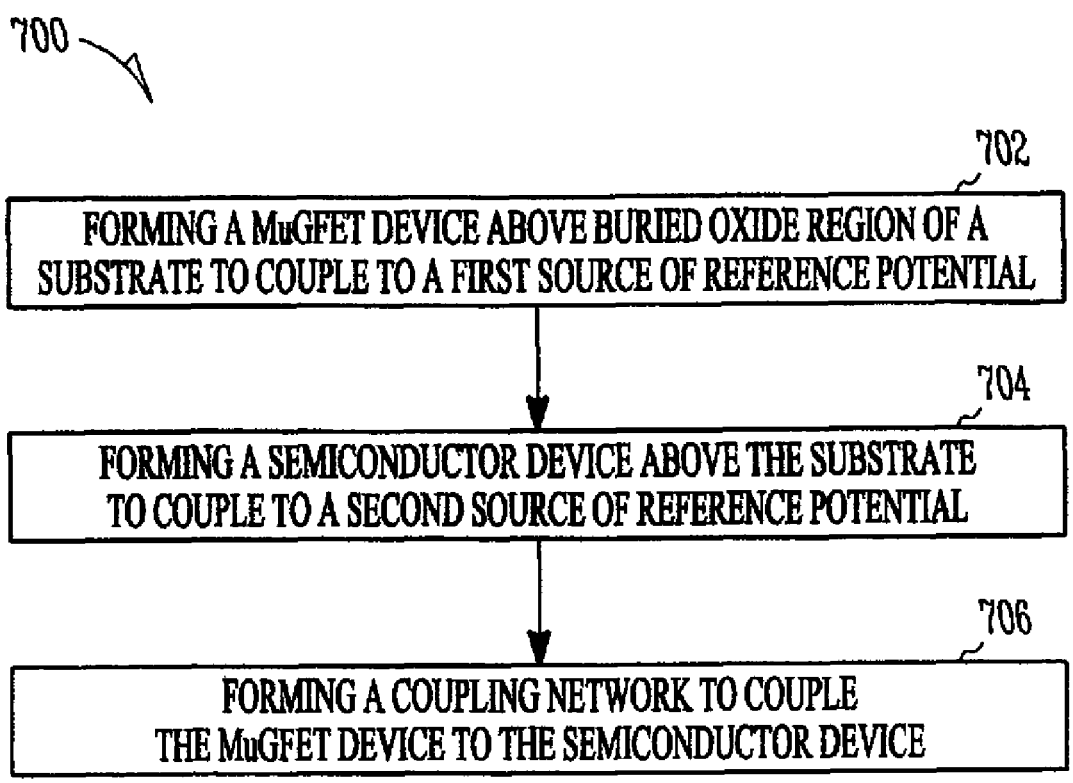
FIG. 7 is a flow chart of some embodiments of a method of forming two circuit blocks above a substrate which are to operate with different sources of reference potential.

FIG. 7 is a flow chart of some embodiments of a method 700 of forming two circuit blocks above a substrate which are to operate with different sources of reference potential. For some embodiments the process includes forming a MuGFET device above buried oxide region of a substrate to couple to a first source of reference potential in box 702. In box 704 the process includes forming a semiconductor device above the substrate to couple to a second source of reference potential. In 706 the process includes forming a coupling network to couple the MuGFET device to the semiconductor device.

In some embodiments, forming the semiconductor device 702 comprises forming a further MuGFET device above buried oxide region of a substrate to couple to a second source of reference potential.

In some embodiments forming the MuGFET device 702 and forming the further MuGFET device 704 also comprise forming a first reference terminal for the first MuGFET device and a second reference terminal for the second MuGFET device, the first and second reference terminals being insulated and isolated from each other.

In some embodiments, at least one of the electronic circuit blocks fabricated according the method described above includes at least one of a planar CMOS FET, a fin FET containing two conducting planes (MOSFET channels) and a multi-gate FET containing 3, 4 or 5 conducting planes.

It should be noted that the methods described herein do not have to be executed in the order described, or in any particular order, unless it is otherwise specified that a particular order is required. Moreover, unless otherwise specified, various activities described with respect to the methods identified herein can be executed in repetitive, simultaneous, serial, or parallel fashion.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . ".

The Abstract of the Disclosure is provided to comply with 37 C.F.R. §1.72(b), requiring the abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. Apparatus, comprising:
   a substrate having a buried oxide insulating region above the substrate;
   a MuGFET device formed directly above the buried oxide region and coupled to a first power source;
   a CMOS semiconductor device formed directly above the substrate without a buried oxide region and coupled to a second power source separate from the first power source; and
   a coupling network to couple the MuGFET device to the CMOS semiconductor device, the coupling network being formed directly above the buried oxide region.

2. The apparatus of claim 1 wherein the MuGFET device is connected to a first power source and the CMOS semiconductor device is connected to a second power source wherein the power sources have different voltages.

3. The apparatus of claim 2 wherein the output of the second power source substantially exceeds the voltage of the first power source.

4. The apparatus of claim 1 wherein the coupling network is a capacitor.

5. The apparatus of claim 1 wherein the semiconductor device is a CMOS device formed above the substrate.

6. The apparatus of claim 1 wherein the coupling network comprises an optical coupling circuit.

7. The apparatus of claim 1 wherein the semiconductor device is a further MuGFET device.

8. The apparatus of claim 1 wherein the coupling network comprises another MuGFET formed above the buried oxide region.

9. The apparatus of claim 1 wherein the coupling network comprises a further MuGFET.

10. The apparatus of claim 1 wherein the MuGFET device and the CMOS semiconductor device are respectively coupled to the first and second power sources via first and second sources of reference terminal.

11. The apparatus of claim 1 wherein the coupling network comprises a transformer.

12. Apparatus, comprising:
   a substrate having a buried oxide insulating region above the substrate;
   a MuGFET device formed directly above the buried oxide region to receive an input at a gate electrode thereof, one of a source region and a drain region of the MuGFET device coupled to a first source of reference potential and the other one of the source region and the drain region of the MuGFET device coupled to a first power source;
   a CMOS semiconductor device supported directly by the substrate with an input terminal thereof coupled to the other one of the source region and the drain region of the MuGFET device and having another terminal thereof coupled to a second source of reference potential and a further terminal thereof coupled to a second power source separate from the first power source; and
   a coupling network to couple the other one of the source region and the drain region of the MuGFET device and the input terminal of the CMOS semiconductor device, the coupling network being formed directly above the buried oxide insulating region.

13. The apparatus of claim 12 wherein the magnitude of the voltage between the second source of reference potential and the second power source substantially exceeds the voltage between the first source of reference potential and the first power source.

14. The apparatus of claim 12 wherein the coupling network is a capacitor.

15. The apparatus of claim 14 wherein the capacitor has one plate thereof connected to the one of the source region and the drain region of the MuGFET device and another plate thereof connected to the input terminal of the CMOS semiconductor device.

16. The apparatus of claim 12 wherein the semiconductor device is a CMOS device supported by the substrate.

17. The apparatus of claim 12 wherein the coupling element comprises an optical coupling circuit.

18. The apparatus of claim 12 wherein the semiconductor device is a further MuGFET device.

19. The apparatus of claim 18 wherein the coupling element comprises another MuGFET formed above the buried oxide region.

20. The apparatus of claim 12 wherein the coupling element comprises a further MuGFET.

21. The apparatus of claim 12 wherein the MuGFET device and the CMOS semiconductor device are respectively coupled to the first and second sources of reference potential via first and second sources of reference terminal.

22. The apparatus of claim 12 wherein the coupling element comprises a transformer.

23. A method, comprising:
   forming a MuGFET device directly on a buried oxide region of a substrate to couple to a first power source;

forming a CMOS semiconductor device directly on the substrate without a buried oxide region and coupled to a second power source separate from the first power source; and forming a coupling network to couple the MuGFET device to the semiconductor device, the coupling network being formed directly above the buried oxide region.

24. The method of claim 23 wherein forming the semiconductor device comprises forming a further MuGFET device above buried oxide region of a substrate to couple to the second power source.

25. The method of claim 23 wherein forming the MuGFET device and forming the further MuGFET device also comprise forming a first reference terminal for the MuGFET device and a second reference terminal for the further MuGFET device, the first and second reference terminals being insulated from each other.

26. Apparatus, comprising:
a substrate having a buried oxide region;
a MuGFET device formed directly on the buried oxide region to receive an input at a gate electrode thereof, one of a source region and a drain region of the MuGFET device coupled to a first power source;
a CMOS semiconductor device formed directly on the substrate with an input terminal thereof coupled to the other one of the source region and the drain region of the MuGFET device and having another terminal thereof coupled to a second source of reference potential and a further terminal thereof coupled to a second power source separate from the first power source; and
means for coupling the MuGFET device to the semiconductor device, wherein the means for coupling the MuGFET device to the semiconductor device being formed directly above the buried oxide region.

* * * * *